US009559495B1

(12) United States Patent
Koenck et al.

(10) Patent No.: US 9,559,495 B1
(45) Date of Patent: Jan. 31, 2017

(54) SYSTEM AND METHOD FOR OPTICAL AMPLIFICATION

(71) Applicants: Steven E. Koenck, Cedar Rapids, IA (US); Robert G. Brown, Tustin, CA (US); David W. Jensen, Marion, IA (US)

(72) Inventors: Steven E. Koenck, Cedar Rapids, IA (US); Robert G. Brown, Tustin, CA (US); David W. Jensen, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 48 days.

(21) Appl. No.: 14/732,277

(22) Filed: Jun. 5, 2015

(51) Int. Cl.
| | |
|---|---|
| *G01J 1/00* | (2006.01) |
| *H01S 5/10* | (2006.01) |
| *H01S 5/32* | (2006.01) |
| *H01S 5/30* | (2006.01) |
| *H01S 5/042* | (2006.01) |
| *G01J 1/04* | (2006.01) |
| *H01L 27/146* | (2006.01) |

(52) U.S. Cl.
CPC .............. *H01S 5/105* (2013.01); *G01J 1/0459* (2013.01); *H01L 27/14625* (2013.01); *H01L 27/14685* (2013.01); *H01S 5/0425* (2013.01); *H01S 5/1078* (2013.01); *H01S 5/3013* (2013.01); *H01S 5/32* (2013.01)

(58) Field of Classification Search
CPC ...... H01S 5/1078; H01S 5/3027; H01S 5/105; H01S 5/30; H01S 5/32; H01S 5/50; H01S 5/3013; H01S 5/3018
See application file for complete search history.

(56) References Cited

U.S. PATENT DOCUMENTS 8,921,826 B2 * 12/2014 Hayat ................... B82Y 20/00
257/13

OTHER PUBLICATIONS

U.S. Appl. No. 14/663,687, filed Mar. 20, 2015, Robert G. Brown et al.
Purcell, E., Spontaneous emission probabilities at radio frequencies, Physical Review, vol. 69, 1946, 1 page.
Yablonovitch, E., Inhibited Spontaneous Emission in Solid-State Physics and Electronics, Physical Review Letters, vol. 58, Issue 20, May 1987, 4 pages.

* cited by examiner

*Primary Examiner* — Tony Ko
(74) *Attorney, Agent, or Firm* — Donna P. Suchy; Daniel M. Barbieri (57) ABSTRACT

An optical amplifier includes a plurality of photon amplifying regions. Each photon amplifying region includes a bottom electrode, an insulating layer formed over the bottom electrode, and having a through hole to the bottom electrode, a semiconductor layer and a top electrode formed over the semiconductor layer, wherein the top and bottom electrodes electrically contact the semiconductor layer. The semiconductor layer is formed over the insulating layer and in the through hole, and has a semiconductor active region in the through hole. The semiconductor active region has a direct electronic band gap with a conduction band edge, and is embedded within a photonic crystal having an electromagnetic band gap having photon energies overlapping the energy of the conduction band edge of the electronic band gap such that spontaneous emission of photons in the semiconductor active region is suppressed.

20 Claims, 10 Drawing Sheets

SYSTEM AND METHOD FOR OPTICAL AMPLIFICATION

BACKGROUND

The inventive concepts disclosed herein relate to a low noise optical amplifier for low light detection, and to optical systems employing such a low noise optical amplifier.

Low light level imaging is important for applications ranging from photography to night vision. One example application is in helmet mounted displays, such that may be deployed on a helmet for a pilot operating an aircraft. Other applications include astronomical imaging. Low light levels may occur, for example, for night time imaging under overcast conditions.

Light detection systems include imaging devices that may employ focal plane array (FPA) detectors. Typically, an FPA will have very many pixels, each pixel appropriate for separately detecting a plurality of impinging photons. Light detectors and FPAs, however, eventually are unable to operate in ultra-low light conditions. At long range, laser illuminator and imaging systems, typically operating at 1064 nm wavelength, also fail.

In low light level imaging conditions, only a few photons per pixel may arrive each frame-time. In this case, the imaging quality in an optical imaging system may be very grainy or noisy, which can render images taken at night unusable. In the lowest light level conditions, so few photons may arrive that no image is captured at all.

SUMMARY

In one aspect, embodiments of the inventive concepts disclosed herein are directed to an optical amplifier. The optical amplifier has a plurality of photon amplifying regions, each photon amplifying region including a bottom electrode. An insulating layer is formed over the bottom electrode, and has a through hole to the bottom electrode. A semiconductor layer is formed over the insulating layer and in the through hole, and has a semiconductor active region in the through hole. The semiconductor active region has a direct electronic band gap with a conduction band edge. The semiconductor active region is embedded within a photonic crystal having an electromagnetic band gap having photon energies overlapping the energy of the conduction band edge of the electronic band gap such that spontaneous emission of photons in the semiconductor active region is suppressed. A top electrode is formed over the semiconductor layer, and the top and bottom electrodes electrically contact the semiconductor layer.

In some embodiments, the semiconductor active region includes a p-n junction.

In some embodiments, the semiconductor layer comprises a group III-V semiconductor.

In some embodiments, the photonic crystal has a predetermined pattern of holes arranged in a portion of the semiconductor layer.

In some embodiments, the top and bottom electrodes are formed of a material transparent to light.

In some embodiments, the top and bottom electrodes comprise indium tin oxide.

In some embodiments, the optical amplifier further has a substrate, where the bottom electrode is formed over the substrate.

In some embodiments, the substrate is one of a substrate transparent to visible light or an image sensor.

In some embodiments, the substrate is a CMOS or CCD image sensor.

In a further aspect, embodiments of the inventive concepts disclosed herein are directed to an array optical detector. The array optical detector has a plurality of stacks, each stack having a plurality of photon amplifying regions. The photon amplifying regions of different stacks are respectively aligned with each other in a vertical direction, and some of the photon amplifying regions are active photon amplifying regions configured to amplify light at a respective predetermined wavelengths. Each active photon amplifying region has a bottom electrode. An insulating layer is formed over the bottom electrode, and has a through hole to the bottom electrode. A semiconductor layer is formed over the insulating layer and in the through hole, and has a semiconductor active region in the through hole. The semiconductor active region has a direct electronic band gap with a conduction band edge. The semiconductor active region is embedded within a photonic crystal having an electromagnetic band gap having photon energies overlapping the energy of the conduction band edge of the electronic band gap such that spontaneous emission of photons in the semiconductor active region is suppressed. A top electrode is formed over the semiconductor layer, wherein the top and bottom electrodes electrically contact the semiconductor layer.

In some embodiments, some of the photon amplifying regions are photon amplifying regions configured to pass light without amplification.

In some embodiments, the photon amplifying regions are arranged to include adjacent active photon amplifying regions in adjacent stacks.

In some embodiments, the adjacent active photon amplifying regions amplify light at respective different wavelengths.

In some embodiments, the semiconductor layers of adjacent active photon amplifying regions are formed of different semiconductor materials.

In some embodiments, the adjacent active photon amplifying regions amplify light at the same wavelength.

In some embodiments, the semiconductor layers of adjacent active photon amplifying regions are formed of the same semiconductor material.

In some embodiments, the stacks are arranged to comprise a plurality of pixels, each pixel having a set of vertically aligned photon amplifying regions.

In some embodiments, each pixel comprises active photon amplifying regions configured to amplify light at a predetermined wavelength and passive photon amplifying regions such that each pixel only amplifies light in one predetermined wavelength band.

In a further aspect, embodiments of the inventive concepts disclosed herein are directed to a method of forming a photon amplifying region of an optical amplifier. A bottom electrode is formed and an insulating layer is formed over the bottom electrode. A through hole is formed in the insulating layer to the bottom electrode. A semiconductor layer is formed over the insulating layer and in the through hole. The semiconductor layer has a semiconductor active region in the through hole. The semiconductor active region has a direct electronic band gap with a conduction band edge. The semiconductor active region is embedded within a photonic crystal having an electromagnetic band gap having photon energies overlapping the energy of the conduction band edge of the electronic band gap such that spontaneous emission of photons in the semiconductor active region is suppressed, A top electrode is formed over the semiconductor layer, and the top and bottom electrodes electrically contact the semiconductor layer.

In some embodiments, the forming a bottom electrode includes forming the bottom electrode on a substrate, wherein the substrate is a CMOS or CCD image sensor.

DETAILED DESCRIPTION

The present inventors have realized that a substantially improved optical imaging system is possible by amplifying those few photon arrivals per frame time per pixel by a low (near-zero) noise amplifier. Such a low noise amplifier has been described by the inventors in U.S. application Ser. No. 14/663,687, entitled "LOW NOISE OPTICAL PRE-AMPLIFIER FOR ULTRA-LOW-LIGHT DETECTORS AND FPAS", filed Mar. 20, 2015, which is incorporated herein in its entirety. In particular, such a low noise amplifier may be provided by disposing a semiconductor amplifier within a photonic crystal, which has a photonic band gap. By appropriately aligning the energy of the conduction band edge of the electronic band gap of the semiconductor amplifier with the photon energy of forbidden wavelength within the photonic band gap, the spontaneous emissions of photons in the semiconductor amplifier may be strongly suppressed. Thus, the noise due to spontaneous emissions of photons in the semiconductor amplifier within the amplification process may be strongly suppressed.

The use of a photonic crystal may suppress the spontaneous emission in a semiconductor, which may spontaneously emit a photon from an electronic transition from the conduction band to the valence band. Photonic crystals are periodic dielectric structures that have an electromagnetic band gap that forbids propagation of a certain frequency range of electromagnetic radiation. In particular, spontaneous emission can be suppressed by appropriate alignment of the photonic crystal band gap with respect to an electronic conduction band edge of a semiconductor material [E. Yablonovitch, '*Inhibited Spontaneous Emission in Solid-State Physics and Electronics*', Phys. Rev. Letts, 58, 2059 (1987)]. If a photonic crystal with a periodic dielectric structure has an electromagnetic band-gap that overlaps the electronic conduction band edge of the semiconductor material embedded in the photonic crystal, then spontaneous emission of photons in the semiconductor material can be suppressed.

Optical amplification in the semiconductor material of the semiconductor active region of the pre-amplifier may be provided by electrically injecting (pumping) the semiconductor band edge of the semiconductor material suitable for amplifying an incoming photon. Appropriate semiconductor materials for optically amplifying photons impinging on the pre-amplifier may be selected from semiconductor materials appropriate for laser light amplification (although lasing does not occur in the semiconductor material of the pre-amplifier). For example, the semiconductor material of the semiconductor active region may be a Group III-V material. Alternatively, the semiconductor material may be a Group IV or Group II-VI material.

Examples are provided below of appropriate semiconductor materials for the active material of a p-n junction for different colors/wavelengths of light: Blue: GaN or wurtzite-crystal-form InGaN and Green: GaN, InGaN or AlGaAs; Red: InGaP or AlInGaP; 1064 nm and 1550 nm: InGaAs.

Figure 1:
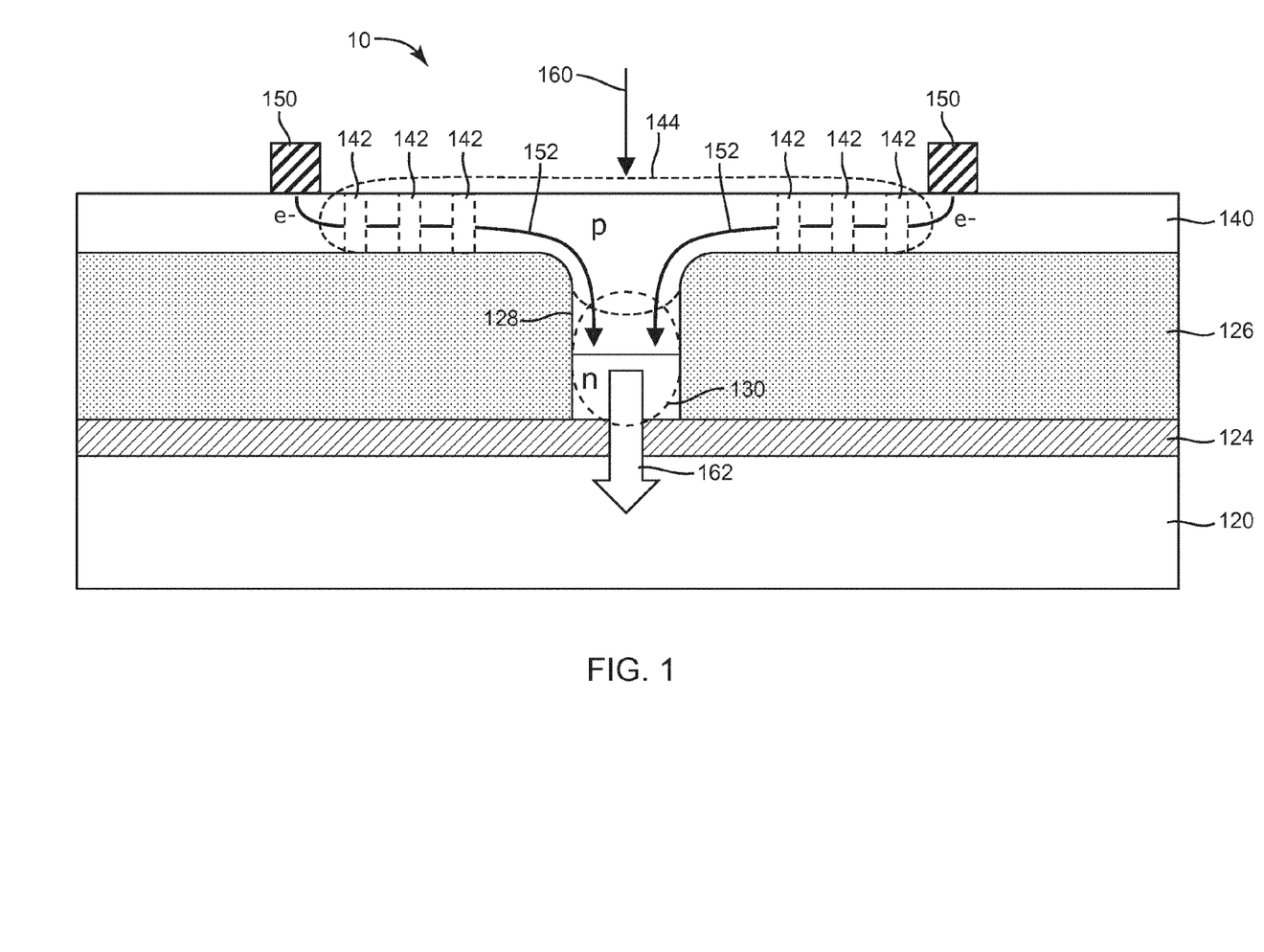
FIG. 1 is a cross-sectional view of a photon amplifying region of an optical amplifier according to an embodiment of the inventive concepts disclosed herein.
Figure 2:
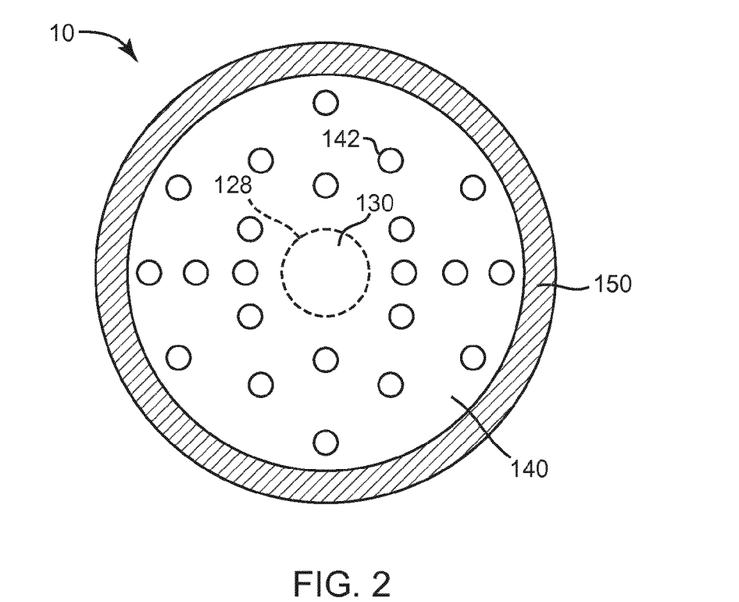
FIG. 2 is a top view of the photon amplifying region of FIG. 1.

FIGS. 1 and 2 illustrate a photon amplifying region 10 of an optical amplifier according to inventive concepts disclosed herein, where FIG. 1 is a side cross-sectional view and FIG. 2 is a top view. The photon amplifying region 10 may include a substrate 120, a bottom electrode 124, an insulating layer 126, a semiconductor layer 140, and a top electrode 150.

The bottom electrode 124 is disposed on the substrate 120 may be formed of a material transparent to visible light, such as indium tin oxide (ITO), for example.

The insulating layer 126 is disposed over the bottom electrode 124. The insulating layer 126 may be any appropriate insulator, such as silicon dioxide, or silicon nitride, for example. A through hole 128 is disposed in the insulating layer 126 and exposes the top of the bottom electrode 124.

The semiconductor layer 140 is formed over the insulating layer 126 and in the through hole 128. The semiconductor layer 140 may be a Group IV, Group II-VI, or a Group III-V material, for example. Appropriate Group III-V materials include, for example, AlGaAs, AlGaInP, GaN, InGaN, InGaP, and InGaAs. The semiconductor layer 140 may be doped to provide a semiconductor active region 130, such as a p-n junction, in the through hole 128.

The semiconductor layer 140 may further include holes 142 formed in a pattern in a top portion of the semiconductor layer 140. The holes 142 are formed in a pattern so that a region of the semiconductor layer 140 functions as a photonic crystal 144.

The semiconductor active region 130 has an electronic band edge having a predetermined energy. The photonic crystal 144 has a hole size and spacing, and a dielectric constant to provide an electromagnetic band gap having a range of photon energies. Photons having energies falling with the electromagnetic band gap are forbidden to propagate within the photonic crystal 144. The photonic crystal 144 has a hole size and spacing, and a dielectric constant to provide an electromagnetic band gap such that the electromagnetic band gap has photon energies that overlap the energy of the conduction band edge of the direct electronic band gap of the semiconductor active region 130. In this case, spontaneous emission of a photon based on an electronic transition from the conduction band edge to the valence band edge is prohibited.

The top electrode 150 is formed over the semiconductor layer 140. The top electrode 150 may be formed of a material transparent to visible light, such as indium tin oxide (ITO), for example. The top and bottom electrodes 124, 150 electrically contact the semiconductor layer 140. An appropriate voltage is applied to the photon amplifying region 10 through electrodes 124 and 150 to inject current 152 and pump the semiconductor conduction band edge of the semiconductor active region 130. The current 152 flow is shown in FIG. 1 from the top electrode 150 to the semiconductor active region 130. The photon amplifying region 10 amplifies incoming electromagnetic radiation 160 impinging on the semiconductor active region 130 into outgoing radiation 162, which is directed to the substrate 120.

The substrate 120 may be an optically clear passive substrate which is transparent to the outgoing radiation 164 of interest. Alternatively, or in addition, the substrate 120 may comprise an image sensor, which detects the outgoing radiation 162. The image sensor may be, for example, a silicon CMOS (complementary metal oxide semiconductor) or charge coupled device (CCD) sensor.

Figure 3:
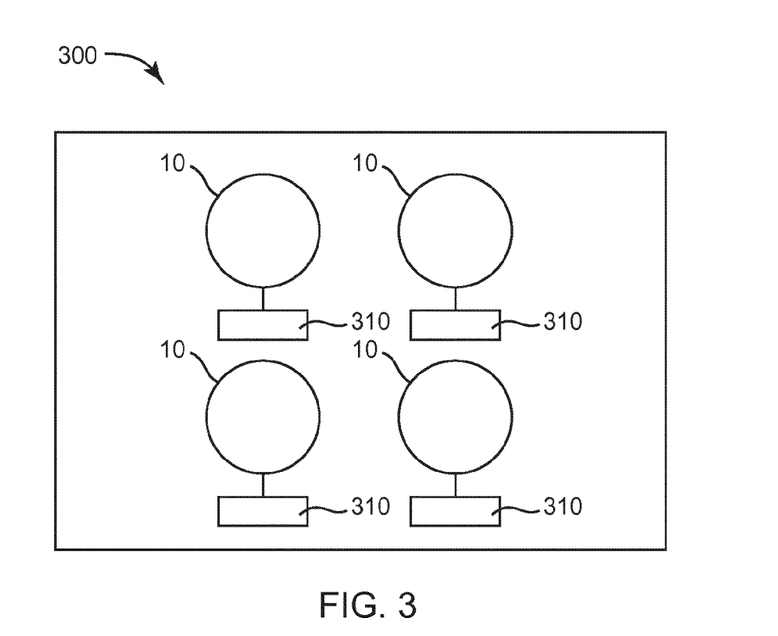
FIG. 3 is a schematic of an optical amplifier according to an embodiment of the inventive concepts disclosed herein.

FIG. 3 illustrates an optical amplifier 300 according to an embodiment of the inventive concepts disclosed herein. The optical amplifier 300 includes a plurality of photon amplifying regions 10 and a plurality of pixel gain control circuits 310. While FIG. 3 illustrates an optical amplifier 300 with only four photon amplifying regions 10, in general the number of photon amplifying regions 10 may be much larger. Each of the pixel gain control circuits 310, which are addressable, corresponds to a different respective photon amplifying region 10, and provides gain for its respective photon amplifying region 10. The pixel gain control circuits 310 are described further below with respect to FIG. 13.

FIGS. 4A-4F illustrate a method of making the photon amplifying region 10 of FIGS. 1 and 2.

Figure 4A:
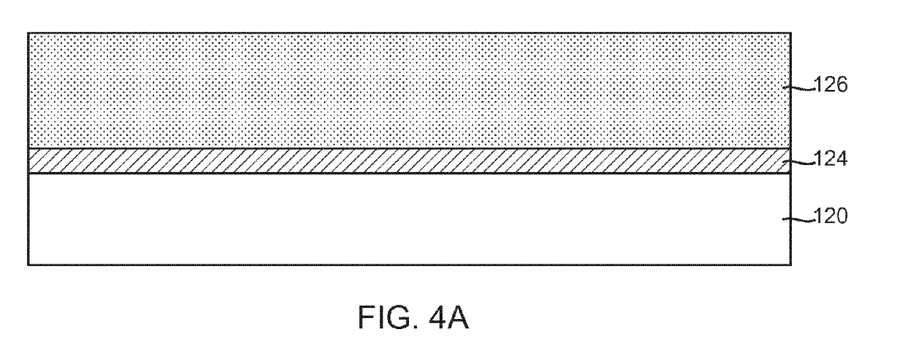
FIGS. 4A-4F illustrate a process of making the photon amplifying region of FIG.

Referring to FIG. 4A, the bottom electrode 124, which may be transparent indium tin oxide (ITO), for example, is deposited over the substrate 120, followed by depositing the insulating layer 126 over the bottom electrode 124. The insulating layer 126 may be silicon dioxide or silicon nitride for example.

Figure 4B:
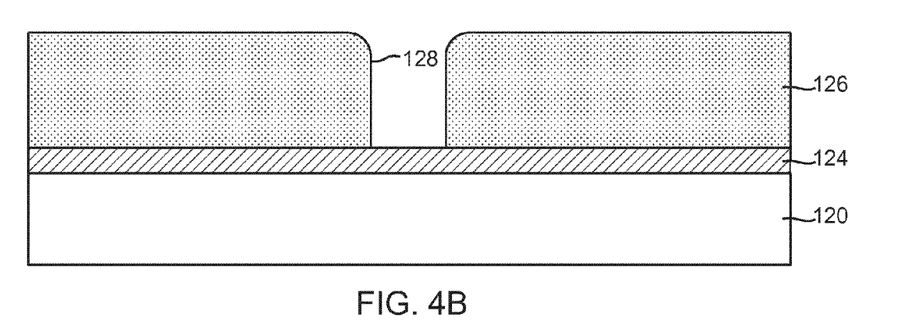

Referring to FIG. 4B, a through hole 128 is formed in the insulating layer 126. The through hole 128 may be formed by a photolithography process where an etch mask is formed on the insulating layer 126, followed by a dry etch to form the through hole 128. The etch mask may be removed after the dry etch.

Figure 4C:
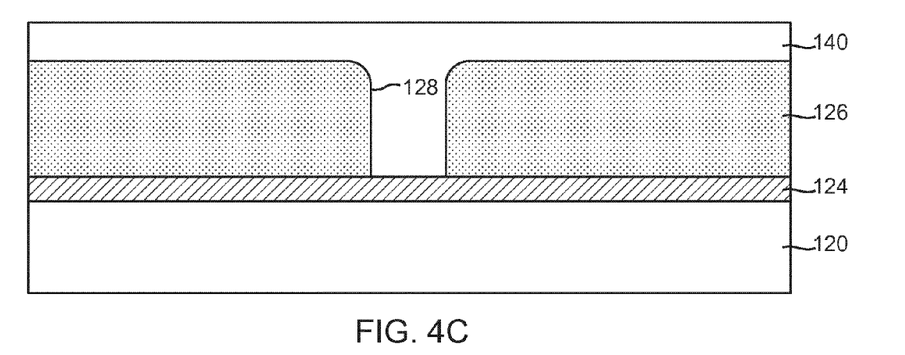

Referring to FIG. 4C, a semiconductor layer 140 is formed over the insulating layer 126 and into the through hole 128. The semiconductor layer 140 may be formed by depositing a semiconductor material. The semiconductor layer material may be a Group IV, Group II-VI, or a Group III-V material, for example. Appropriate Group III-V materials include, for example, AlGaAs, AlGaInP, GaN, InGaN, InGaP, and InGaAs.

Figure 4D:
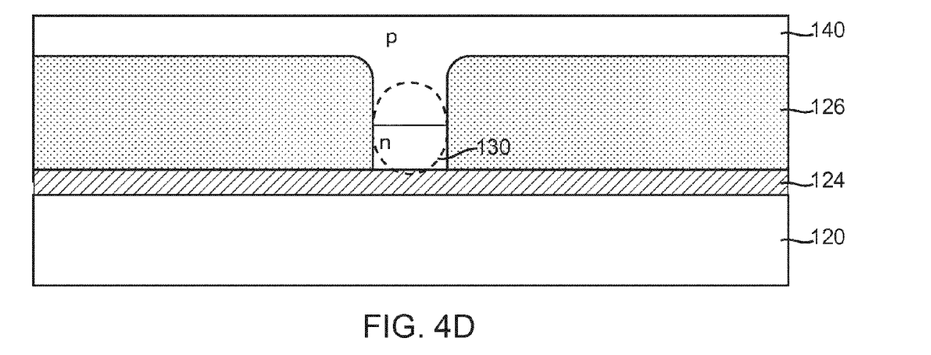

Referring to FIG. 4D, the semiconductor layer 140 is then doped in the through hole 128 region to form a semiconductor active region 130. For example, if the semiconductor layer 140 is n-type as deposited, the semiconductor layer 140 may be doped to be p-type in the upper pixel area and through hole 128 region. In this case, the p-type and n-type regions form a p-n junction at their boundary as an active region 130.

Figure 4E:
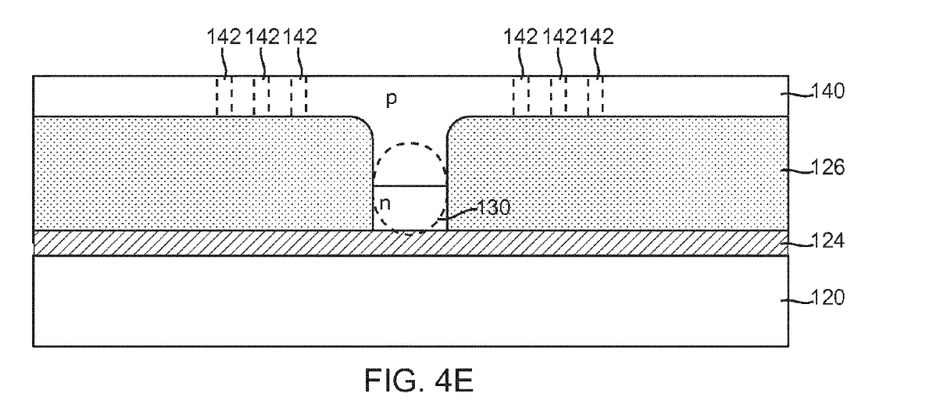

Referring to FIG. 4E, the holes 142 are formed in the semiconductor layer 140 by a photolithography process where an etch mask is formed on the semiconductor layer 140, followed by a dry etch to form the holes 142. The etch mask may then be removed after the dry etch. Alternatively, the holes 142 may be formed by focused ion beam or other processes capable of maintaining precise finished dimensions with a generally cylindrical shape.

Figure 4F:
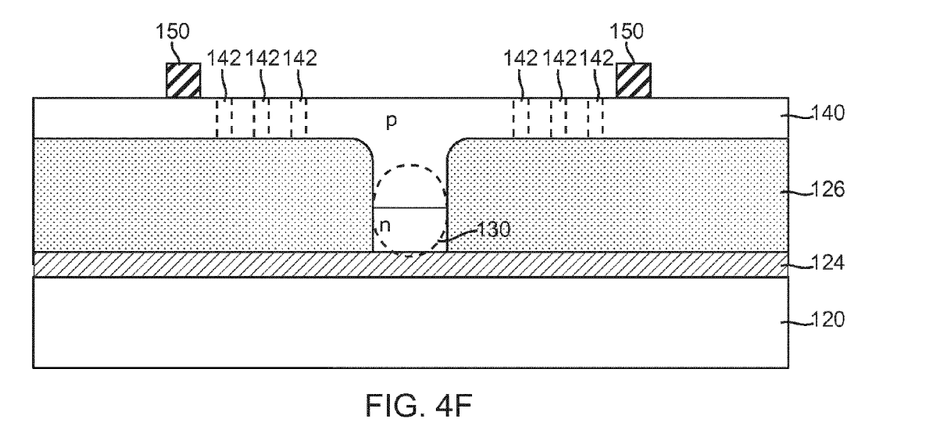

Referring to FIG. 4F, the top electrode 150 is formed over the semiconductor layer 140. The top electrode 150 which may be formed by depositing a conducting material layer, such as by depositing transparent indium tin oxide (ITO), for example, followed by patterning the conducting material layer to form the top electrode 150. The patterning may be performed by a photolithography process where an etch mask is formed on the conducting material layer, followed by a dry etch to form the top electrode 150. The etch mask may then be removed after the dry etch.

Figure 5:
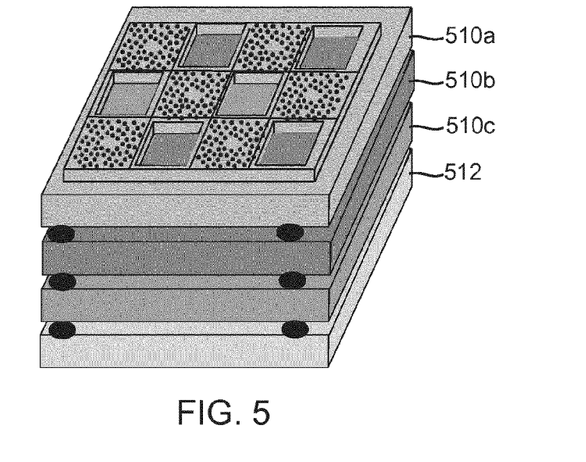
FIG. 5 is a proportional view of an array optical detector according to an embodiment of the inventive concepts disclosed herein.
Figure 6:
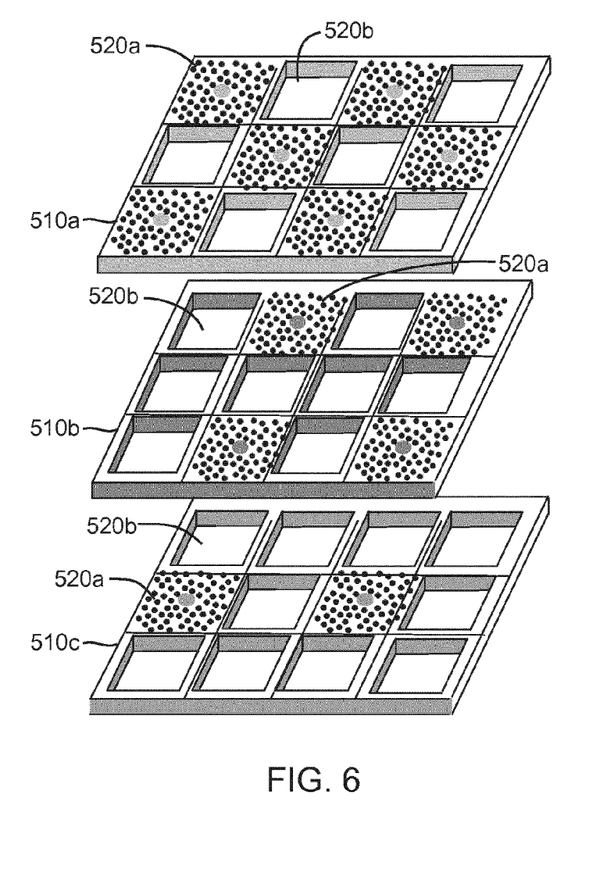
FIG. 6 is an exploded view illustrating stacks of the array optical detector of FIG. 5.

FIGS. 5 and 6 illustrate an array optical detector 500 according to an embodiment of the inventive concepts disclosed herein with a stacked structure, where FIG. 6 is an exploded view of the stacked structure of FIG. 5.

The array optical detector 500 has a plurality of stacks 510a, 510b, and 510c, and an underlying substrate 512. The underlying substrate 512 may be an image sensor array for example. Each of the stacks has a plurality of photon amplifying regions 520, which may be either active photon amplifying regions 520a, or passive photon amplifying regions 520b. The active photon amplifying regions 520a are configured to amplify light at a particular predetermined wavelength, such as green, blue or red light, for example. In contrast, the passive photon amplifying regions 520b do not amplify light impinging thereon, but instead allow the light to pass through the passive photon amplifying regions 520b.

The active photon amplifying regions 520a may have the structure of the photon amplifying region 10 as described with respect to FIGS. 1 and 2, for example. In contrast, the passive photon amplifying regions 520b have a hole (see hole region 170 in FIG. 9, for example), which allows photons to pass unamplified.

Referring to FIGS. 5 and 6, the photon amplifying regions 520a and 520b of different stacks 510a, 510b, and 510c are respectively aligned with each other in the vertical direction. For example, the upper left photon amplifying region 520a of the stack 510a is directly above the upper left photon amplifying region 520b of the stack 510b, which in turn is directly above the upper left photon amplifying region 520b of the stack 510c. While the upper left region has an active photon amplifying region 520a over two passive photon amplifying regions 520b, in general different arrangements of active and passive photon amplifying regions are possible.

Figure 7:
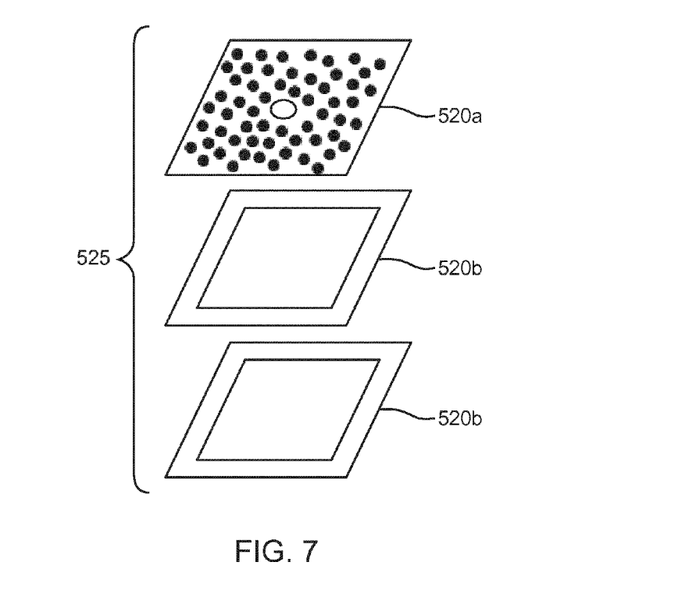
FIG. 7 is an exploded view illustrating a pixel of the array optical detector of FIG. 5.

Referring to FIG. 7, a pixel 525 of the array optical detector 500 comprises a set of vertically aligned photon amplifying regions. For example, the upper left pixel comprises the upper left photon amplifying region 520a of the stack 510a, the upper left photon amplifying region 520b of the stack 510b, and the upper left photon amplifying region 520b of the stack 510c. While the upper left region has an active photon amplifying region 520a over two passive photon amplifying regions 520b, in general different arrangements of active and passive photon amplifying regions are possible.

Returning to FIGS. 5 and 6, the optical detector 500 has its pixels arranged such that each pixel comprises active photon amplifying regions 520a configured to amplify light at a predetermined wavelength and passive photon amplifying regions 520b, such that each pixel only amplifies light in one predetermined wavelength band. That is, all of the active photon amplifying regions 520a of a particular pixel 525 (see FIG. 7) amplify light at the same wavelength.

The stacks 510a, 510b and 510c, may be arranged such that all of the active photon amplifying regions 520a in a particular stack only amplify light in a single wavelength band. Thus, for visible light, each stack 510a, 510b, and 510c amplifies only light of one particular wavelength. In this way, each stack 510a, 510b, and 510c amplifies only light of one particular color. For example, stack 510a may amplify green light, stack 510b may amplify red light and stack 510c may amplify blue light. In this example, the semiconductor layer material for the active photon amplifying regions of the stack 510a may be AlGaAs, for example, the semiconductor layer material for the active photon amplifying regions of the stack 510b may be AlGaInP, for example, and the semiconductor layer material for the active photon amplifying regions of the stack 510c may be AlGaP, GaN or wurtzite-crystal-form InGaN compound semiconductor, for example.

Figure 8:
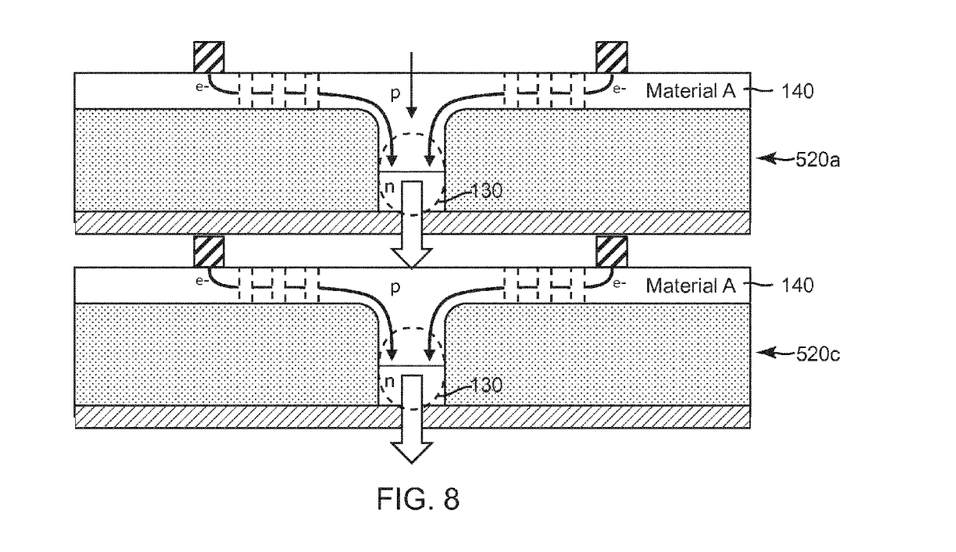
FIG. 8 is a cross-sectional view illustrating a stacked arrangement of photon amplifying regions with an active photon amplifying region stacked over another active photon amplifying region having the same semiconductor material according to an embodiment of the inventive concepts disclosed herein.

FIG. 8 illustrates a portion of an array optical detector, such as for example, a portion of the array optical detector of FIGS. 5 and 6, with an active photon amplifying region 520a stacked directly over another active photon amplifying region 520a. The top active photon amplifying region 520a is part of the stack 510a, while the bottom active photon amplifying region 520a is part of stack 510b. Thus, the top active photon amplifying region 520a and the bottom photon amplifying region 520a are part of the same pixel. The semiconductor layer 140 of the active photon amplifying region 520a has an active region 130 in its center which amplifies an incoming photon, for both the top and bottom active photon amplifying regions 520a. The semiconductor layer 140 of the top active photon amplifying region 520a is formed of a same semiconductor material as that of the bottom active photon amplifying region 520a, and amplifies a same light wavelength as that of the bottom active photon amplifying region 520a. This configuration enables multiple gain processing for increased photon amplification.

Figure 9:
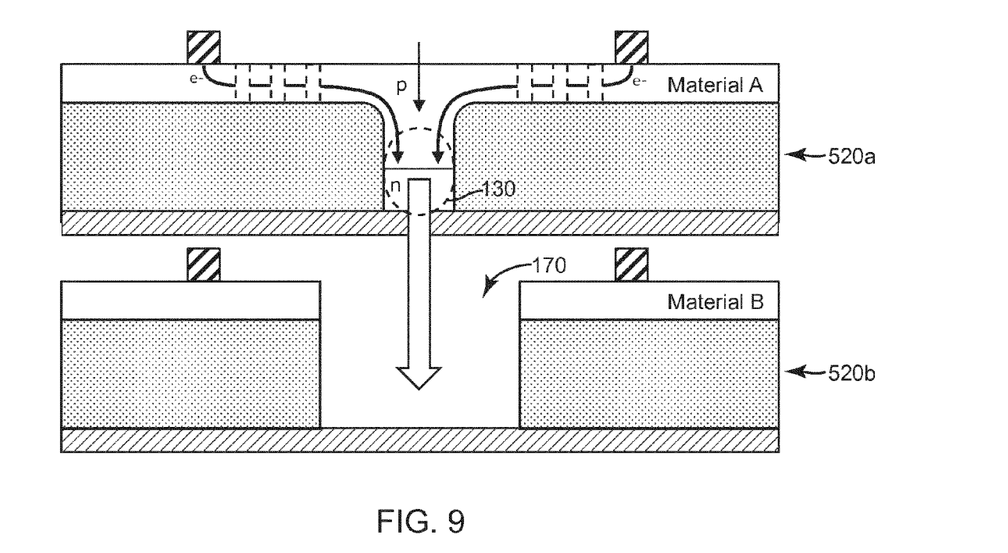
FIG. 9 is a cross-sectional view illustrating a stacked arrangement of photon amplifying regions with an active photon amplifying region stacked over a passive photon amplifying region according to an embodiment of the inventive concepts disclosed herein.

FIG. 9 illustrates a portion of an array optical detector, such as for example, a portion of the array optical detector of FIGS. 5 and 6, with an active photon amplifying region 520a stacked directly over a passive photon amplifying region 520b. Thus, the active photon amplifying region 520a and the passive photon amplifying region 520b are part of the same pixel. The active photon amplifying region 520a is part of the stack 510a, while the passive photon amplifying region 520b is part of stack 510b. The semiconductor layer 140 of the active photon amplifying region 520a has an active region 130 in its center which amplifies an incoming photon, whereas the passive photon amplifying region 520b has a hole region 170 in the center of semiconductor layer 140, which allows photons to pass unamplified.

Figure 10:
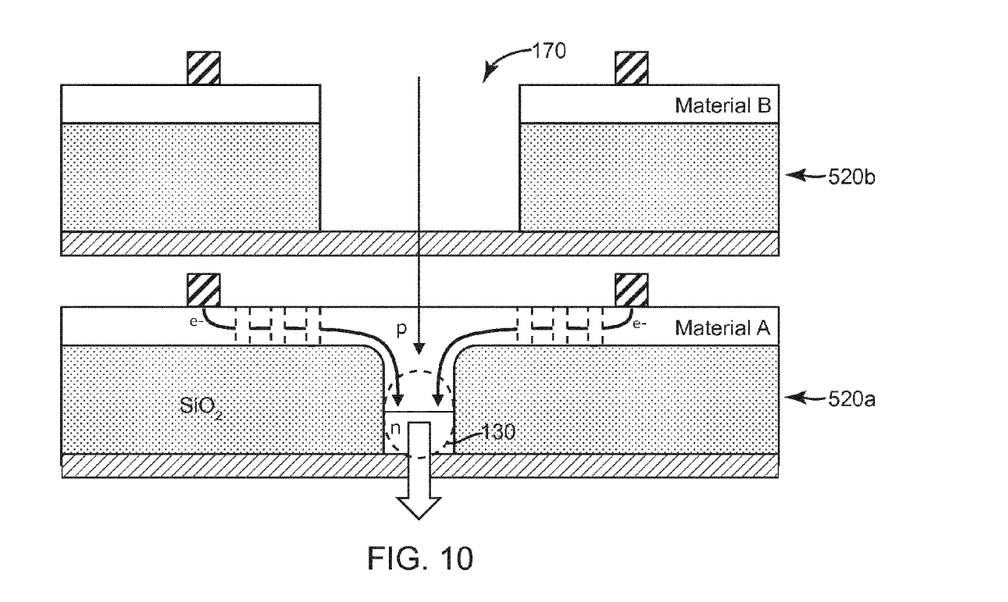
FIG. 10 is a cross-sectional view illustrating a stacked arrangement of photon amplifying regions with a passive photon amplifying region stacked over an active photon amplifying region according to an embodiment of the inventive concepts disclosed herein.

FIG. 10 illustrates a portion of an array optical detector, such as for example, a portion of the array optical detector of FIGS. 5 and 6, with a passive photon amplifying region 520b stacked directly over an active photon amplifying region 520a. Thus, the active photon amplifying region 520a and the passive photon amplifying region 520b are part of the same pixel. Otherwise, the portion of the array detector of FIG. 10 is the same as that of FIG. 9. That is in FIG. 10, the active photon amplifying region 520a is part of the stack 510a, while the passive photon amplifying region 520b is part of stack 510b. The semiconductor layer 140 of the active photon amplifying region 520a has an active region 130 in its center which amplifies an incoming photon, whereas the passive photon amplifying region 520b has a hole region 170 in the center of semiconductor layer 140, which allows photons to pass unamplified. The hole region 170 may include a transparent material or vacuum which allows photons to pass unamplified.

Figure 11:
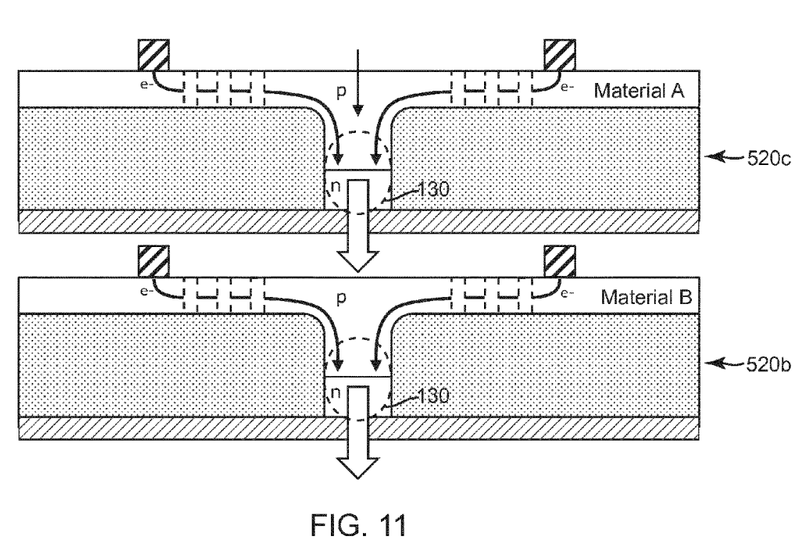
FIG. 11 is a cross-sectional view illustrating a stacked arrangement of photon amplifying regions with an active photon amplifying region stacked over another active photon amplifying region having a different semiconductor material according to an embodiment of the inventive concepts disclosed herein.

FIG. 11 illustrates a portion of an array optical detector, such as for example, a portion of the array optical detector of FIGS. 5 and 6, with an active photon amplifying region 520a stacked directly over another active photon amplifying region 520a. The top active photon amplifying region 520a is part of the stack 510a, while the bottom active photon amplifying region 520a is part of stack 510b. Thus, the top active photon amplifying region 520a and the bottom photon amplifying region 520a are part of the same pixel. The semiconductor layer 140 of the active photon amplifying region 520a has an active region 130 in its center which amplifies an incoming photon, for both the top and bottom active photon amplifying regions. The semiconductor layer 140 of the top active photon amplifying region 520a, however, is formed of a different semiconductor material than that of the bottom active photon amplifying region 520a, and amplifies a different light wavelength than that of the bottom active photon amplifying region 520a.

Figure 12:
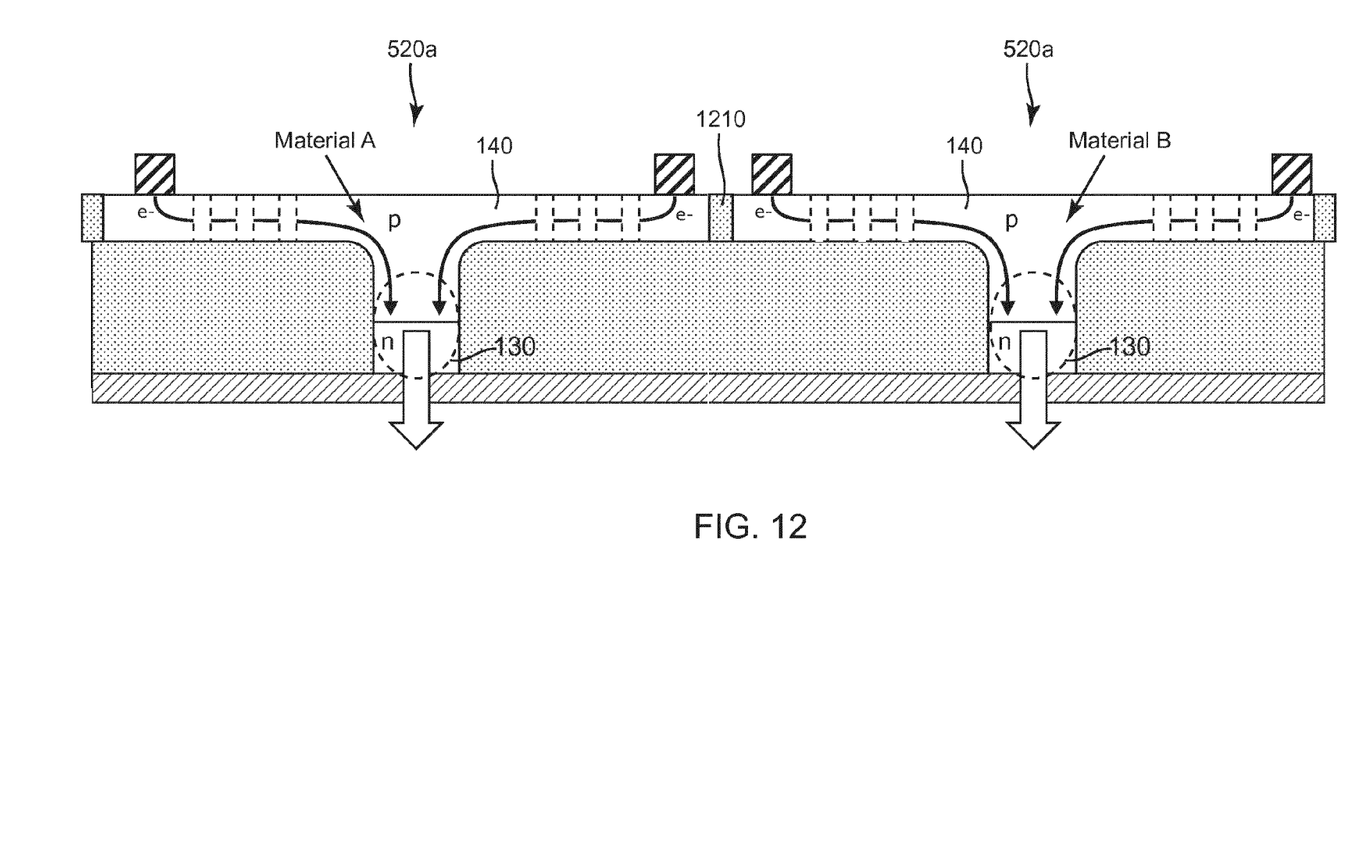
FIG. 12 is a cross-sectional view illustrating an arrangement of laterally spaced photon amplifying regions with an active photon amplifying region laterally spaced from another active photon amplifying region having a different semiconductor material according to an embodiment of the inventive concepts disclosed herein.

FIG. 12 illustrates a portion of an array optical detector, such as for example, a portion of the array optical detector of FIGS. 5 and 6, with laterally adjacent active photon amplifying regions 520a. Thus, the laterally adjacent active photon amplifying regions 520a are part of laterally adjacent pixels, and part of a same stack 510. The semiconductor layer 140 of the left active photon amplifying region 520a is different from that of the right active photon amplifying region 520a, and the left active photon amplifying region 520a amplifies light at a different photon wavelength from that of the right active photon amplifying region 520a. In FIG. 12 an isolation region 1210 is formed between the adjacent active photon amplifying regions 520a. While FIG. 12 illustrates two active photon amplifying regions, in general the array detector will have many more photon amplifying regions than two.

Figure 13:
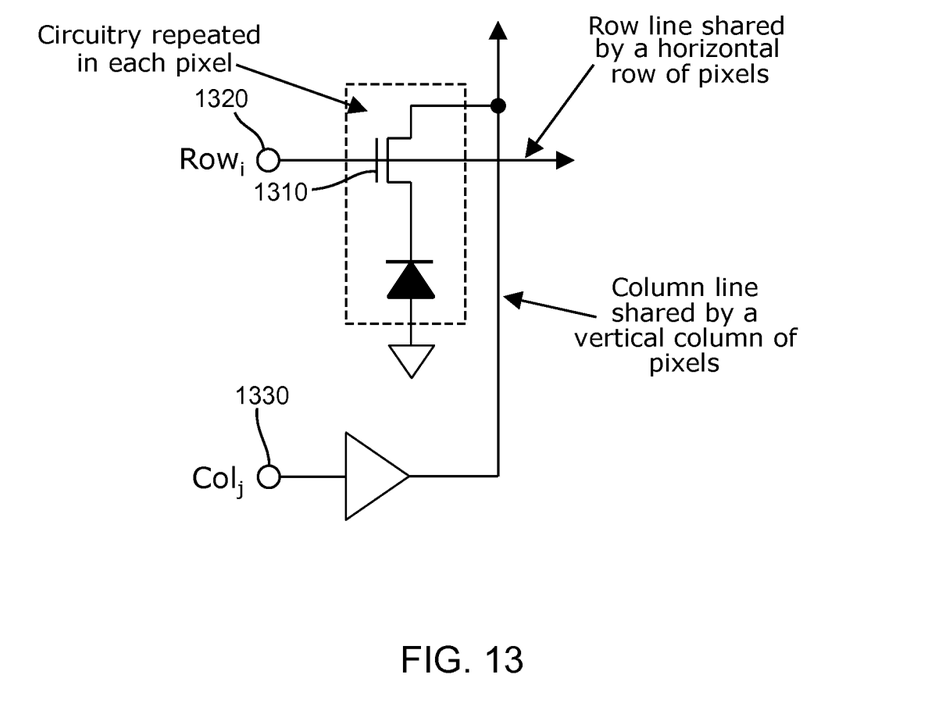
FIG. 13 is a schematic of a gain control circuit for a pixel according to an embodiment of the inventive concepts disclosed herein.

FIG. 13 illustrates an addressable gain control circuit 1300, for providing gain to a respective active photon amplifying region 520a. For ease of illustration, FIG. 13 shows the addressable gain control circuit 1300 for providing gain to the photon amplifying region 520a in row i and column j. The addressable gain control circuit 1300 is addressable via a row signal input 1320 for Row$_i$, and a column signal input 1330 for Col$_j$. The photon amplifying region 520a is accessed via the switch 1310, which may be a transistor. Every pixel has its own gain control circuit.

Heterojunctions may be used in fabrication of production Electrically Pumped Photon Intensifying Crystal (EPPIC) devices. Heterojunctions use differing semiconductor materials for the emitter-base junction and the base-collector junction. These heterojunctions are often used in high speed or high power devices to improve gain and power efficiency. They also enable higher doping levels and will provide a broader implementation design space for EPPIC technology. The single junction diagrams of this application teach the fundamental fabrication design and do not preclude the introduction or use of heterojunction devices.

The embodiments of the invention have been described in detail with particular reference to preferred embodiments thereof, but it will be understood by those skilled in the art that variations and modifications can be effected within the spirit and scope of the invention.

What is claimed is:

1. An optical amplifier, comprising:
a plurality of photon amplifying regions, each photon amplifying region comprising:
a bottom electrode;
an insulating layer formed over the bottom electrode, and having a through hole to the bottom electrode;
a semiconductor layer formed over the insulating layer and in the through hole, and having a semiconductor active region in the through hole, the semiconductor active region having a direct electronic band gap with a conduction band edge, the semiconductor active region embedded within a photonic crystal having an electromagnetic band gap having photon energies overlapping the energy of the conduction band edge of the electronic band gap such that spontaneous emission of photons in the semiconductor active region is suppressed; and
a top electrode formed over the semiconductor layer, wherein the top and bottom electrodes electrically contact the semiconductor layer.

2. The optical amplifier of claim 1, wherein the semiconductor active region comprises a p-n junction.

3. The optical amplifier of claim 1, wherein the semiconductor layer comprises a group III-V semiconductor.

4. The optical amplifier of claim 1, wherein the photonic crystal has a predetermined pattern of holes arranged in a portion of the semiconductor layer.

5. The optical amplifier of claim 1, wherein the top and bottom electrodes are formed of a material transparent to light.

6. The optical amplifier of claim 5, wherein the top and bottom electrodes comprise indium tin oxide.

7. The optical amplifier of claim 1, further comprising a substrate, where the bottom electrode is formed over the substrate.

8. The optical amplifier of claim 7, wherein the substrate is one of a substrate transparent to visible light or an image sensor.

9. The optical amplifier of claim 8, wherein the substrate is a CMOS or CCD image sensor.

10. An array optical detector, comprising:
a plurality of stacks, each stack comprising a plurality of photon amplifying regions, the photon amplifying regions of different stacks respectively aligned with each other in a vertical direction, wherein some of the photon amplifying regions are active photon amplifying regions configured to amplify light at a respective predetermined wavelengths, each active photon amplifying region comprising:
a bottom electrode;
an insulating layer formed over the bottom electrode, and having a through hole to the bottom electrode;
a semiconductor layer formed over the insulating layer and in the through hole, and having a semiconductor active region in the through hole, the semiconductor active region having a direct electronic band gap with a conduction band edge, the semiconductor active region embedded within a photonic crystal having an electromagnetic band gap having photon energies overlapping the energy of the conduction band edge of the electronic band gap such that spontaneous emission of photons in the semiconductor active region is suppressed; and
a top electrode formed over the semiconductor layer, wherein the top and bottom electrodes electrically contact the semiconductor layer.

11. The array optical detector of claim 10, wherein some of the photon amplifying regions are passive photon amplifying regions configured to pass light without amplification.

12. The array optical detector of claim 11, wherein the stacks are arranged to comprise a plurality of pixels, each pixel comprising a set of vertically aligned photon amplifying regions.

13. The array optical detector of claim 12, wherein each pixel comprises active photon amplifying regions configured to amplify light at a predetermined wavelength and passive photon amplifying regions such that each pixel only amplifies light in one predetermined wavelength band.

14. The array optical detector of claim 10, wherein the photon amplifying regions are arranged to include adjacent active photon amplifying regions in adjacent stacks.

15. The array optical detector of claim 14, wherein the adjacent active photon amplifying regions amplify light at respective different wavelengths.

16. The array optical detector of claim 15, wherein the semiconductor layers of adjacent active photon amplifying regions are formed of different semiconductor materials.

17. The array optical detector of claim 14, wherein the adjacent active photon amplifying regions amplify light at the same wavelength.

18. The array optical detector of claim 17, wherein the semiconductor layers of adjacent active photon amplifying regions are formed of the same semiconductor material.

19. A method of forming a photon amplifying region of an optical amplifier, comprising:
forming a bottom electrode;
forming an insulating layer over the bottom electrode;
forming a through hole in the insulating layer to the bottom electrode;
forming a semiconductor layer over the insulating layer and in the through hole, the semiconductor layer having a semiconductor active region in the through hole, the semiconductor active region having a direct electronic band gap with a conduction band edge, the semiconductor active region embedded within a photonic crystal having an electromagnetic band gap having photon energies overlapping the energy of the conduction band edge of the electronic band gap such that spontaneous emission of photons in the semiconductor active region is suppressed; and
forming a top electrode over the semiconductor layer, wherein the top and bottom electrodes electrically contact the semiconductor layer.

20. The method of claim 19, wherein the forming a bottom electrode comprises forming the bottom electrode on a substrate, wherein the substrate is a CMOS or CCD image sensor.

* * * * *